(12) United States Patent
Ohta et al.

(10) Patent No.: US 8,441,017 B2
(45) Date of Patent: May 14, 2013

(54) SCHOTTKY BARRIER DIODE AND METHOD FOR MAKING THE SAME

(75) Inventors: Shingo Ohta, Kyoto (JP); Tatsuya Kiriyama, Kyoto (JP); Takashi Nakamura, Kyoto (JP); Yuji Okamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/150,635

(22) Filed: Jun. 1, 2011

(65) Prior Publication Data

US 2011/0250736 A1   Oct. 13, 2011

Related U.S. Application Data

(62) Division of application No. 11/975,366, filed on Oct. 18, 2007, now Pat. No. 7,973,318.

(30) Foreign Application Priority Data

Oct. 18, 2006  (JP) ................................ 2006-283253

(51) Int. Cl.
*H01L 29/24* (2006.01)
(52) U.S. Cl.
USPC ........ 257/77; 257/73; 257/454; 257/E29.104; 257/E21.067; 438/570; 438/572
(58) Field of Classification Search ........... 438/478, 438/570, 92, 534; 257/E21.09, 453, 471, 257/77, 73, 478
See application file for complete search history.

(56) References Cited

U.S. PATENT DOCUMENTS

| | | | | |
|---|---|---|---|---|
| 4,594,602 A * | 6/1986 | Iimura et al. | ............... | 257/610 |
| 4,611,385 A * | 9/1986 | Forrest et al. | ............... | 438/16 |
| 4,816,424 A * | 3/1989 | Watanabe et al. | ............ | 438/653 |
| 5,262,668 A * | 11/1993 | Tu et al. | ............... | 257/475 |
| 5,929,523 A * | 7/1999 | Parsons | ............... | 257/750 |
| 6,175,143 B1 * | 1/2001 | Fujihira et al. | ............ | 257/471 |
| 6,303,969 B1 * | 10/2001 | Tan | ............... | 257/484 |
| 7,507,650 B2 | 3/2009 | Nakamura et al. | | |
| 2002/0019117 A1 | 2/2002 | Nagasawa | | |
| 2003/0183895 A1 | 10/2003 | Okamura et al. | | |
| 2006/0006394 A1 * | 1/2006 | Kordina | ............... | 257/77 |
| 2006/0183267 A1 * | 8/2006 | Roccaforte et al. | ............ | 438/92 |
| 2007/0134897 A1 * | 6/2007 | Nakamura et al. | ............ | 438/570 |

FOREIGN PATENT DOCUMENTS

| | | |
|---|---|---|
| JP | 2004-022878 | 1/2004 |
| JP | 2004-221513 | 8/2004 |
| JP | 2005-311347 | 11/2005 |
| WO | WO 2007/094421 | 8/2007 |

* cited by examiner

*Primary Examiner* — Thinh T Nguyen
(74) *Attorney, Agent, or Firm* — Hamre, Schumann, Mueller & Larson, P.C.

(57) ABSTRACT

A schottky diode includes a SiC substrate which has a first surface and a second surface facing away from the first surface, a semiconductor layer which is formed on the first surface of the SiC substrate, a schottky electrode which is in contact with the semiconductor layer, and an ohmic electrode which is in contact with the second surface of the SiC substrate. The first surface of the SiC substrate is a (000-1) C surface, upon which the semiconductor layer is formed.

12 Claims, 3 Drawing Sheets

SCHOTTKY BARRIER DIODE AND METHOD FOR MAKING THE SAME

CROSS REFERENCE TO RELATED APPLICATIONS

This application is a Division of U.S. Ser. No. 11/975,366, filed Oct. 18, 2007, which is incorporated herein by reference.

BACKGROUND OF THE INVENTION

1. Field of the Invention

The present invention relates to a schottky barrier diode and a method of making the same.

2. Description of Related Art

FIG. 6 is a conventional schottky barrier diode (hereinafter called "schottky diode.") (See JPA-2004-221513 for example.) The schottky diode X shown in this figure uses a SiC substrate 91 as a basis. The SiC substrate 91 has a (0001) Si surface 91b and a (000-1) C surface 91a. The (0001) Si surface 91b is formed with an epitaxial layer 92. The epitaxial layer 92 is formed with a guard ring 92a. On the epitaxial layer 92, an insulation layer 93, a schottky electrode 94 and a metal layer 95 are formed in lamination. A contact hole 93a is made in the insulation layer 93 to provide contact between the schottky electrode 94 and the epitaxial layer 92. The contact made by the schottky electrode 94 and the epitaxial layer, 92 is schottky contact. The (000-1) C surface 91a is formed with an ohmic electrode 96. The contact made by the ohmic electrode 96 and the SiC substrate 91 is ohmic contact. The schottky diode X is used to provide a relatively high-speed switching in electric circuits.

In the schottky diode X, the schottky barrier height between the schottky electrode 94 and the epitaxial layer 92 must have an appropriate value in order to reduce leak current caused by reverse voltage. However, in the above-described design where the epitaxial layer 92 is formed on the (0001) Si surface 91b, the best achievable schottky barrier height was about 1.0 eV, and for this reason, it has not been possible in the schottky diode X to sufficiently reduce the leak current caused by reverse voltage.

SUMMARY OF THE INVENTION

The present invention has been proposed under the above-described circumstance, and it is therefore an object of the present invention to provide a schottky diode which has a reduced leak current caused by reverse voltage, and to provide a method for making the schottky diode.

A schottky diode provided by a first aspect of the present invention includes: a SIC substrate which has a first surface and a second surface facing away from the first surface; a semiconductor layer which is formed on the first surface of the SiC substrate; a schottky electrode which is in contact with the semiconductor layer; and an ohmic electrode which is in contact with the second surface of the SiC substrate. The first surface of the SiC substrate is a (000-1) C surface, and the semiconductor layer is formed on this (000-1) C surface.

According to such an arrangement as the above, the schottky barrier height between the schottky electrode and the epitaxial layer has a value large enough to reduce the leak current, and therefore it is possible to decrease the leak current in the schottky diode.

Preferably, the schottky electrode is made of Mo. Such an arrangement as the above makes it possible to achieve appropriate ohmic contact between the schottky electrode and the epitaxial layer.

Preferably, the barrier height between the semiconductor layer and the schottky electrode is 1.3 through 1.7 eV. Such an arrangement as the above makes it possible to reduce the leak current to about 1/10 of the leak current as compared to a case where the epitaxial layer is formed on the (0001) Si surface of the SiC substrate.

A second aspect of the present invention provides a method for making a schottky diode. This method includes a step of forming a semiconductor layer on a (000-1) C surface of a SiC substrate; a step of forming an ohmic electrode on a (0001) Si surface of the SiC substrate; and a step of forming a schottky electrode on the semiconductor layer after the step of forming an ohmic electrode.

Preferably, the method according to the present invention further includes a step of performing a heat treatment at a temperature between 200 through 1,000° C. to a laminated body provided by the SiC substrate, the semiconductor layer, the ohmic electrode and the schottky electrode after forming the schottky electrode. Such an arrangement as the above is suitable for achieving the schottky barrier height which has a value between 1.3 through 1.7 eV.

Other characteristics and advantages of the present invention will become clearer from the following detailed description to be made with reference to the attached drawings.

DETAILED DESCRIPTION OF THE PREFERRED EMBODIMENT

Preferred embodiments of the present invention will be described below with reference to the drawings.

Figure 1:
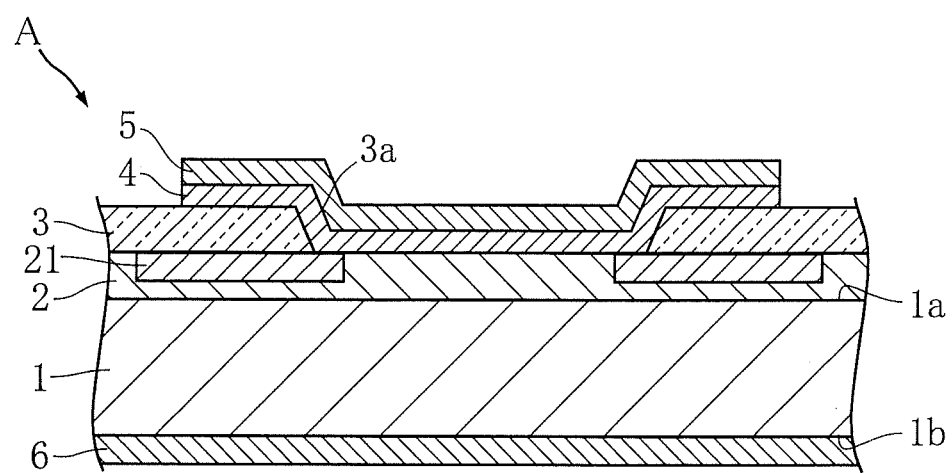
FIG. 1 is a sectional view showing a primary, portion of a schottky diode according to the present invention.

FIG. 1 shows a schottky diode according to the present invention. The illustrated schottky diode A includes a SiC substrate 1, an epitaxial layer 2, an insulation layer 3, a schottky electrode 4, a metal layer 5, and an ohmic electrode 6. The schottky diode A is a type of rectifier implemented by using a schottky barrier formed by a junction between a metal and a semiconductor, and has advantages over rectifiers implemented by using a PN junction, in that voltage drop in normal direction is smaller and switching speed is higher.

The SiC substrate 1 is an $n^+$ type 4H-SiC substrate doped with impurity to an extent that the substrate has a resistivity of 0.01 through 0.05 Ωm. The SiC substrate 1 has a (000-1) C surface 1a and a (0001) Si surface 1b.

The epitaxial layer 2 is made of an $n^-$ type Si C of a relatively high level of purity, with its impurity density of $1.0 \times 10^{15}$ through $2.0 \times 10^{16}$ $cm^{-3}$ for example. The epitaxial layer 2 is formed on the (000-1) C surface 1a of the substrate 1. The epitaxial layer 2 is formed with a guard ring 21. The guard ring 21 is an annular portion formed by ion injection using such an element as Al and B into a part of the epitaxial layer 2, and enhances voltage endurance of the schottky diode A.

The insulation layer 3 is a member formed of e.g. Si O$_2$ or Si$_3$N$_4$. The insulation layer 3 provides partial coverage on each of the epitaxial layer 2 and the guard ring 21. The insulation layer 3 has a contact hole 3a. The contact hole 3a exposes the inner circumferential edge of the guard ring 21.

The schottky electrode 4 is made of e.g. Mo, and works to form a schottky barrier between itself and the epitaxial layer 2. The schottky electrode 4 is in contact with part of the epitaxial layer 2 and part of the guard ring 21 exposed by the contact hole 3a of the insulation layer 3. In the present embodiment, the schottky barrier height between the schottky electrode 4 and the epitaxial layer 2 is 1.3 through 1.7 eV.

The metal layer 5 is made of Al for example, and covers the schottky electrode 4. A layer of e.g. Ti or MoN may be formed between the metal layer 5 and the schottky electrode 4.

The ohmic electrode 6 is formed on the (0001) Si surface 1b of the SiC substrate 1, and works as an electrode to inject electrons into the schottky diode A. The ohmic electrode 6 is used to solder the schottky diode A to e.g. a circuit substrate. In order to enable appropriate soldering, the ohmic electrode 6 is formed to have a multilayer structure provided by e.g. Ti, Ni and Ag.

Next, a method for making the schottky diode A will be described with reference to FIG. 2 through FIG. 5.

Figure 2:
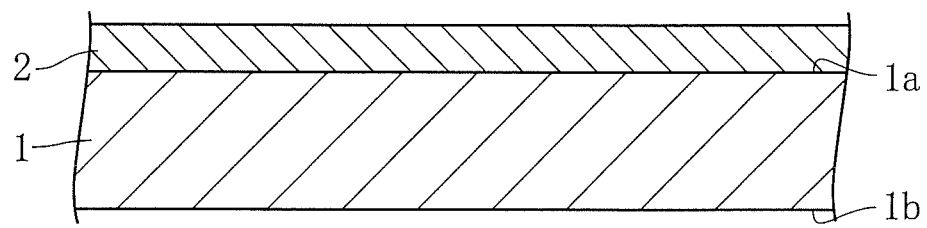
FIG. 2 is a sectional view showing a step of forming an epitaxial layer as part of a method for making the schottky diode.

First, as shown in FIG. 2, a SiC substrate 1 is prepared. The SiC substrate 1 is made by e.g. sublimation method or HTCVD method. Next, epitaxial layer 2 is formed on the (000-1) C surface 1a of the SiC substrate 1. The formation of the epitaxial layer 2 can be performed by epitaxially growing an n⁻ type SiC by supplying row material gas (propane gas, silane gas), carrier gas (H$_2$ gas), and dopant gas (N$_2$ gas) toward the (000-1) C surface 1a, for example.

Figure 3:
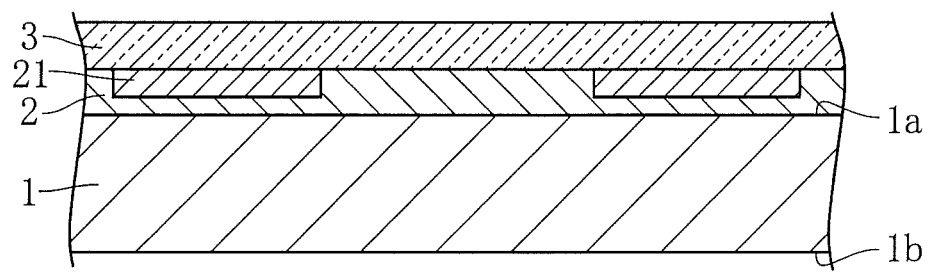
FIG. 3 is a sectional view showing a step of forming an insulation layer as part of the method.

Next, as shown in FIG. 3, a guard ring 21 is formed. The guard ring 21 can be formed through ion injection of e.g. Al, B, etc. into part of the epitaxial layer 2 to a depth of 0.1 through 1.0 µm. After forming the guard ring 21, an insulation layer 3 is formed. The insulation layer 3 can be formed by e.g. spattering with SiO$_2$ or Si$_3$N$_4$.

Figure 4:
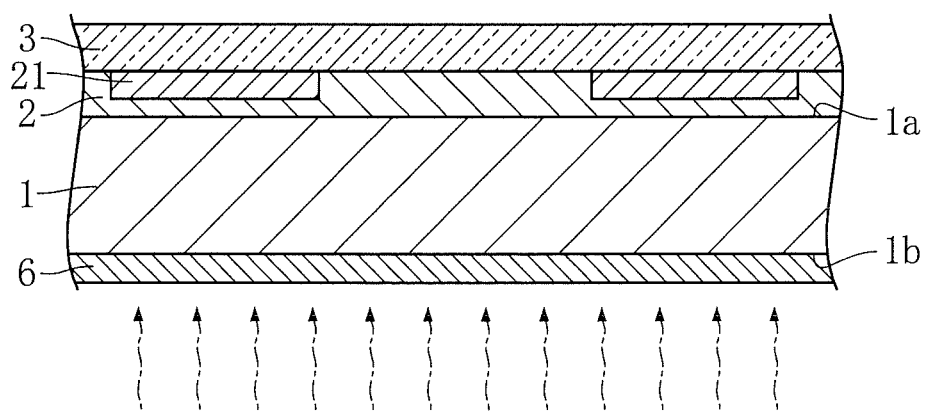
FIG. 4 is a sectional view showing a step of forming an ohmic electrode as part of the method.

Next, an ohmic electrode 6 is formed on the (0001) Si surface 1b of the substrate 1. The ohmic electrode 6 is formed by making layers of Ti, Ni and of Ag through spattering or vapor deposition. Through this step, a laminated body (1, 2, 21, 3, 6) shown in FIG. 4 is obtained. After the formation of the ohmic electrode 6, a heat treatment is performed in which the laminated body is exposed to an ambient temperature not lower than 900° C. for a time not shorter than a minute. Through this heat treatment, state of contact between the ohmic electrode 6 and the SiC substrate 1 becomes ohmic.

Figure 5:
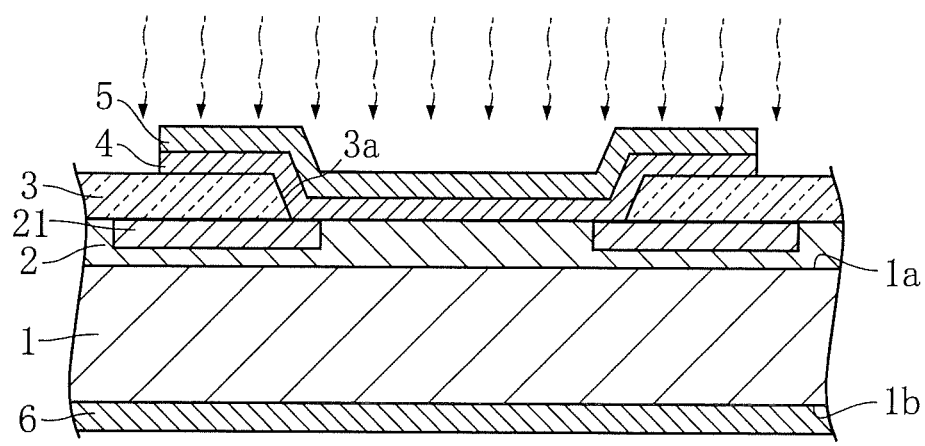
FIG. 5 is a sectional view showing a step of forming a schottky electrode as part of the method.

After the heat treatment which has yielded the ohmic contact, a contact hole 3a is made as shown in FIG. 5, in the insulation layer 3 by means of etching for example. Then, spattering or vapor depositing is performed to form layers of Mo and of Al. The Mo layer and the Al layer are then patterned lithographically to form a schottky electrode 4 and a metal layer 5. Through this step, a second laminated body (1, 2, 21, 3, 4, 5, 6) shown in FIG. 5 is obtained.

Thereafter, the second laminated body undergoes a heat treatment in which the laminated body is exposed to an ambient temperature of 200° C. through 1,000° C. According to experiments conducted by the inventor et al., a schottky barrier height of about 1.5 eV was achievable in a heat treatment at an ambient temperature of 450° C. for 20 minutes. Also, a schottky barrier height of about 1.4 eV was achievable in a heat treatment at an ambient temperature of 450° C. for 100 minutes.

Through the steps described above, a schottky diode A shown in FIG. 1 is obtained. It should be noted here that a preferred temperature range for the heat treatment performed after the formation of the schottky electrode 4 is 200 through 1,000° C. This ambient temperature range is suitable for adjusting a schottky barrier height to 1.3 through 1.7 eV.

Next, description will be made for functions of the schottky diode A and the method for making it.

As described, the schottky diode A has a schottky barrier height of 1.3 through 1.7 eV. With the schottky barrier height being such, it is possible to reduce the leak current in the schottky diode A than before. For example, the leak current in the schottky diode A can be about 1/10 of the leak current in a conventional schottky diode which has a schottky barrier height of about 1.0 eV.

Figure 6:
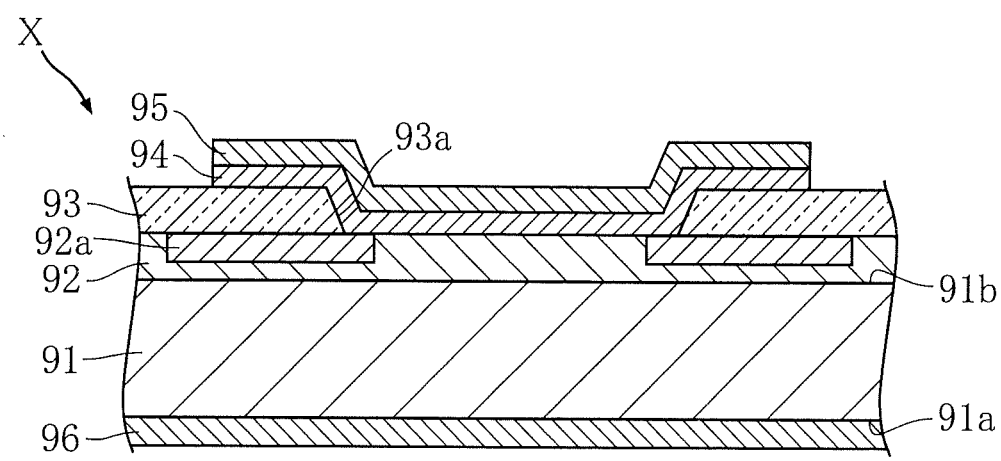
FIG. 6 is a sectional view showing a primary portion of a conventional schottky diode.

Unlike the present invention, the construction shown in FIG. 6 where the epitaxial layer 92 is formed on the (0001) Si surface 91b can only achieve the schottky barrier height of up to 1.0 through 1.1 eV. On the contrary, according to the present embodiment, the epitaxial layer 2 is formed on the (000-1) C surface 1a of the the substrate 1. This makes it possible to achieve a relatively large value of about 1.3 through 1.7 eV for the schottky barrier height between the epitaxial layer 2 and the schottky electrode 4.

The schottky electrode 4 formed of Mo is suitable for creating schottky contact between the electrode and the epitaxial layer 2.

According to the method for making the schottky diode A, a heat treatment for creating ohmic contact is performed at a relatively high temperature (900° C. or higher), and the schottky electrode 4 is formed thereafter. This eliminates a risk that the schottky barrier height will be unduly lowered by the heat treatment.

The invention claimed is:

1. A schottky diode comprising:
   a SiC substrate including a first surface and a second surface opposite to the first surface;
   a semiconductor layer formed on the first surface of the SiC substrate;
   a schottky electrode in contact with the semiconductor layer;
   an ohmic electrode in contact with the second surface of the SiC substrate; and
   an insulation layer formed on the semiconductor layer and including a rear surface and a front surface opposite to the rear surface, the rear surface being closer to the semiconductor layer than the front surface is, the insulation layer being formed with an opening through which a part of the semiconductor layer is exposed;
   wherein the insulation layer includes an inner side surface defining the opening, the inner side surface being inclined with respect to a normal direction of the first surface of the SiC substrate so that the opening becomes greater in cross section as proceeding away from the semiconductor layer,
   wherein the schottky electrode extends from the exposed part of the semiconductor layer, on the inner side surface of the insulation layer, and onto the front surface of the insulation layer,
   wherein a schottky barrier height between the semiconductor layer and the schottky electrode is in a range from 1.3 through 1.7 eV.

2. The schottky diode according to claim 1, wherein the schottky electrode is made of Mo.

3. The schottky diode according to claim 1, further comprising a metal layer formed on the schottky electrode.

4. The schottky diode according to claim 3, further comprising an additional layer made of Ti or MoN and disposed between the schottky electrode and the metal layer.

5. The schottky diode according to claim 3, wherein the metal layer is made of Al.

6. The schottky diode according to claim 1, wherein the semiconductor layer is formed on a (000-1) C surface of the SiC substrate.

7. The schottky diode according to claim 1, wherein the ohmic electrode comprises a laminate of Ti, Ni and Ag layers.

8. The schottky diode according to claim 3, wherein the metal layer includes a first portion and a second portion, the first portion being arranged to overlap the opening as viewed in the normal direction, the second portion being arranged to overlap the front surface of the insulation layer as being viewed in the normal direction.

9. The schottky diode according to claim 8, wherein a distance between the first portion of the metal layer and the first surface of the semiconductor layer is smaller than a distance between the second portion of the metal layer and the first surface of the semiconductor layer.

10. The schottky diode according to claim 8, wherein the metal layer includes an intermediate portion connecting the first portion and the second portion to each other, and the schottky electrode includes a portion disposed between the intermediate portion of the metal layer and the inner side surface of the insulation layer.

11. The schottky diode according to claim 10, wherein the first portion of the metal layer includes a first metal surface facing in a direction in which the first surface of the semiconductor layer faces, and the second portion of the metal layer includes a second metal surface facing in a direction in which the first metal surface faces, wherein a distance between the first metal surface and the first surface of the semiconductor layer is smaller than a distance between the second metal surface and the first surface of the semiconductor layer.

12. The schottky diode according to claim 11, wherein the intermediate portion includes a third metal surface connecting the first metal surface and the second metal surface to each other, the third metal surface being inclined with respect to the normal direction.

* * * * *